United States Patent [19]
Belanger, Jr.

[11] Patent Number: 5,307,980
[45] Date of Patent: May 3, 1994

[54] SOLDER PAD CONFIGURATION FOR WAVE SOLDERING

[75] Inventor: Thomas D. Belanger, Jr., Saline, Mich.

[73] Assignee: Ford Motor Company, Dearborn, Mich.

[21] Appl. No.: 16,329

[22] Filed: Feb. 10, 1993

[51] Int. Cl.⁵ .............................................. H05K 1/00
[52] U.S. Cl. .................................. 228/56.3; 361/736
[58] Field of Search ............. 228/56.3, 37, 179, 180.2, 228/263.11; 361/403, 406, 409; 437/209; 174/260

[56] References Cited
U.S. PATENT DOCUMENTS

| | | |
|---|---|---|
| 4,034,467 | 7/1977 | Sapunarow et al. . |
| 4,164,778 | 8/1979 | Sawairi et al. ..................... 361/406 |
| 4,339,784 | 7/1982 | Shearer . |
| 4,637,541 | 1/1987 | Tanny . |
| 4,645,114 | 2/1987 | Van Den Brekel et al. . |
| 4,772,762 | 9/1988 | Fukino . |
| 4,851,966 | 7/1989 | Roback et al. ..................... 361/406 |
| 4,870,225 | 9/1989 | Anao et al. . |
| 4,874,907 | 10/1989 | Ishikawa et al. ................... 361/406 |
| 4,916,807 | 4/1990 | Wiese . |
| 5,144,535 | 9/1992 | Megens et al. . |
| 5,155,904 | 10/1992 | Majd . |

FOREIGN PATENT DOCUMENTS 2732529 7/1977 Fed. Rep. of Germany .

Primary Examiner—Samuel M. Heinrich
Attorney, Agent, or Firm—Mark L. Mollon; Roger L. May

[57] ABSTRACT

A printed circuit board is provided with a solder pad configuration for wave soldering a surface mount device with its longitudinal axis in a direction perpendicular to the solder wave. A leading solder pad is not wider than the surface mount device. A trailing solder pad is wider than the surface mount device, thereby ensuring that the trailing pad is sufficiently wet by the solder wave.

3 Claims, 2 Drawing Sheets

SOLDER PAD CONFIGURATION FOR WAVE SOLDERING

BACKGROUND OF THE INVENTION

The invention relates generally to wave soldering of surface mount devices to a printed circuit board, and more specifically to the size and configuration of the solder pads when a surface mounted device is oriented on a printed circuit board with its axis parallel to the direction the circuit board moves through a wave soldering machine.

Prior art wave soldering of a surface mount device (SMD) on a printed circuit board involves mounting the device with its contact ends on equally sized solder pads. The solder pads and SMD are oriented such that the axis of the SMD is perpendicular to the direction that the PC board will pass over the solder wave in a wave solder machine. This placement allows each end of the SMD to directly receive molten solder without the SMD blocking the flow of solder which would otherwise prevent the deposit of solder on the blocked pad.

An important aim in the design and layout of printed circuit boards is to minimize their size. Therefore, components must be packed together in the most efficient way possible. The requirement to orient all SMDs perpendicular to the wave-solder direction has limited packing efficiency in the prior art. Thus, it is very desirable to allow placement of an SMD with any orientation and with a sufficient amount of solder being deposited on each solder pad by wave soldering.

SUMMARY OF THE INVENTION

To increase the layout efficiency of a printed circuit board, the surface mount device body axis is placed parallel to the direction the PC board passes through the solder wave. In order to get a sufficient amount of molten solder to wet the surface of the trailing solder pad, the size of the leading solder pad is decreased so it is not wider than the surface mount device. The trailing solder pad is widened so that a sufficient amount of solder is deposited on its surface.

Briefly, a preferred embodiment of the present invention includes a printed circuit board, a surface mount device having a first end and a second end, a first solder pad deposited on the printed circuit board having a width not greater than the width of the first end and a second solder pad deposited on the printed circuit board having a width greater than the width of the second end. The first and second pads are oriented so that the first end is wave soldered before the second end.

In addition to allowing flexible positioning of surface mounted devices, the invention provides the further advantage that by decreasing the size of the first solder pad, the overall packing efficiency is further increased.

DETAILED DESCRIPTION OF THE INVENTION

Figure 1:
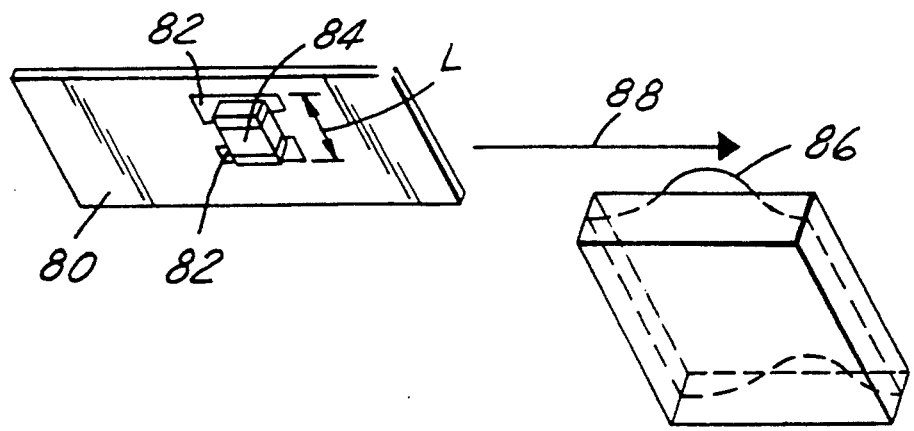
FIG. 1 is prior art showing the position of the solder pads relative to the solder wave.

Referring now to FIG. 1, in the prior art a printed circuit board 80 with solder pads 82 and surface mount device (SMD) 84 is placed through a solder wave 86 in a direction 88. SMD 84 is positioned so that its longitudinal length L is perpendicular to direction 88 This insures that SMD 84 will not obstruct the solder flow thereby permitting a sufficient amount of solder to wet the surface of solder pads 82.

Figure 2:
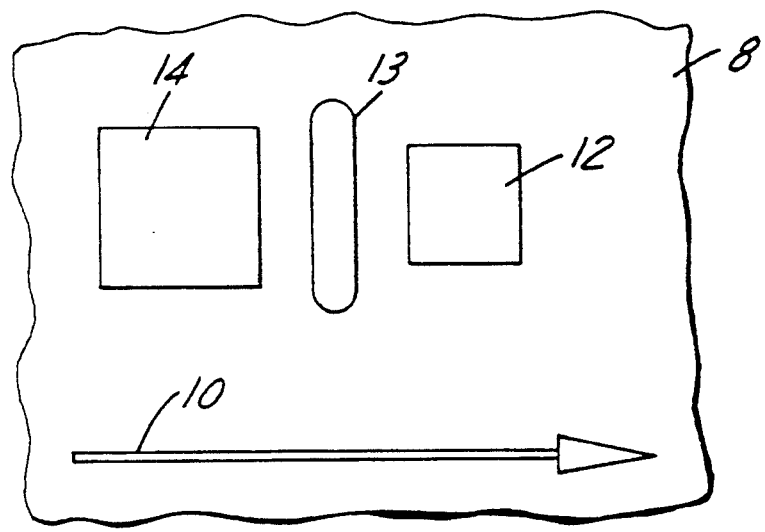
FIG. 2 is a preferred embodiment of the invention showing the relative size and position of the solder pads on a printed circuit board.
Figure 3:
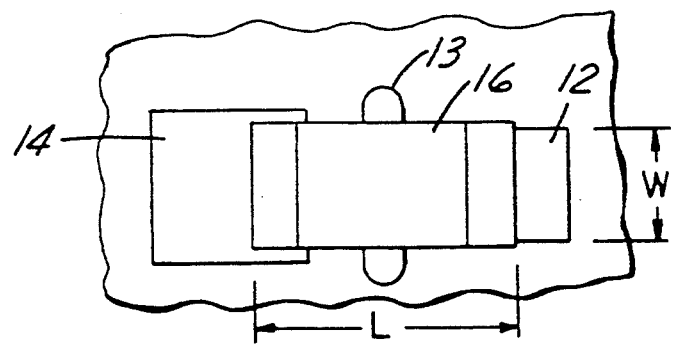
FIG. 3 is the pad layout of FIG. 1 with a surface mount device mounted thereon.

Referring now to FIGS. 2 and 3, the layout of a trailing solder pad 14 is shown with respect to a leading solder pad 12 on a printed circuit board 8. Leading solder pad 12 and trailing solder pad 14 are preferably made of a metallic foil deposited on the surface of printed circuit board 8. SMD 16 is initially glued to glue pad 13. The glue pad 13 is is on the same plane as the solder pads to hold SMD 16 in place prior to the wave soldering process. Printed circuit board 8 is inserted in a wave soldering machine along a direction 10 parallel to the axis of the solder pads (i.e., perpendicular to the molten solder wave front). Leading solder pad 12 is the first solder pad to go through the solder wave followed by SMD 16 and trailing solder pad 14. Leading solder pad 12 is perferably narrower, but no wider, than SMD 16. Trailing solder pad 14 is wider than SMD 16 to insure that a sufficient amount of molten solder is deposited on the surface of trailing solder pad 14 to make reliable electrical connection with SMD 16. For example, using a 1206 size SMD, which is 0.12 inches by 0.06 inches, the width of trailing solder pad 14 may be about 0.075 inches, or approximately 0.015 inches wider than the body of SMD 16.

The molten solder has a wetting characteristic which, upon contact with the solder pads, allows the solder to adhere to and coat the metallic surface of the contact pads. Leading solder pad 12 is made equal to or narrower than the width of SMD 16, and the turbulent flow of molten solder around SMD 16 allows trailing solder pad 14 to become suffieciently wet with solder. Leading solder pad 12 should be of a sufficient width to retain enough solder for a reliable connection, e.g., about 0.055 inches using a 1206 size device. The reduced size of leading solder pad 12 increases the available board space allowing a greater board packing efficiency. A sufficient length for both the solder pads using a 1206 was found to be 0.075 inches.

Figure 4:
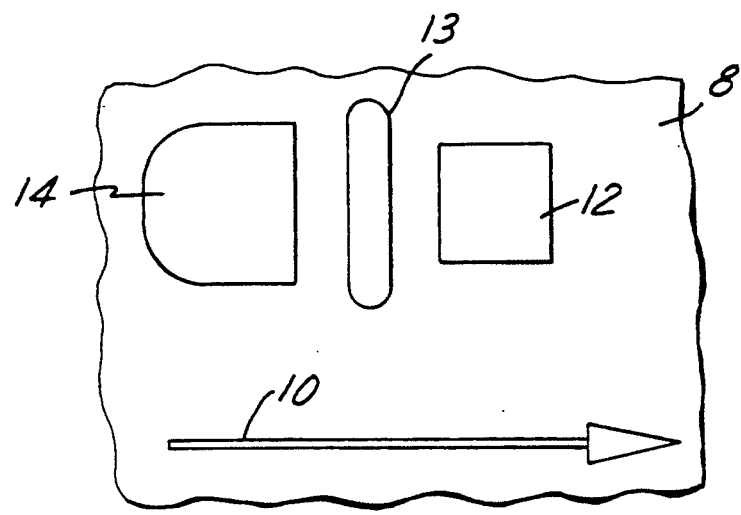
FIG. 4 is an alternative embodiment of the invention showing an alternative shape of the trailing solder pad.
Figure 5:
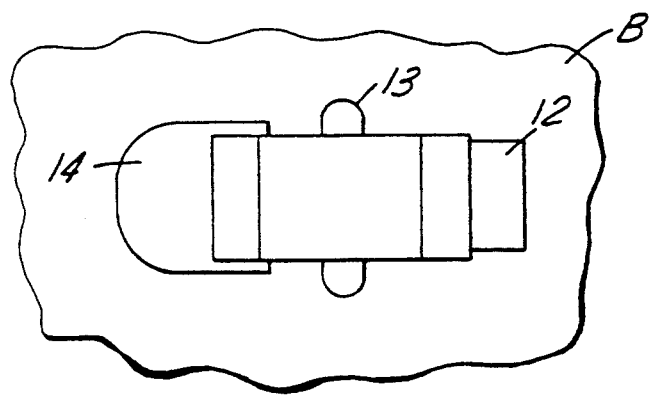
FIG. 5 is the pad layout of FIG. 3 with a surface mount device mounted thereon.

Now referring to FIGS. 4 and 5, an alternative embodiment is shown having radii on the trailing corners of trailing solder pad 14. Continuing the above example with a trailing pad width of 0.075 inches and a 1206 size SMD, a radius of 0.028 inches is used to allow a sufficient amount of solder to wet the pad surface. By rounding the trailing corners, the available board space is further increased.

Figure 6:
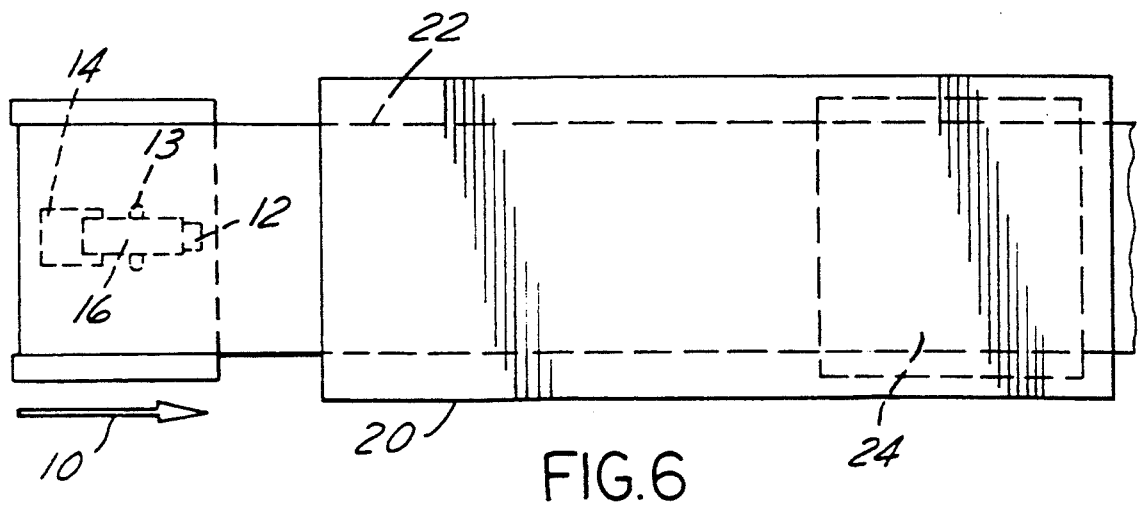
FIG. 6 shows the printed circuit board on a wave soldering machine.

Now referring to FIG. 6, to solder SMD 16 with printed circuit board 8, SMD 16 is first glued to glue pad 13 on the bottom of printed circuit board 8. The assembly is placed on conveyor rails 22 with SMD side down and moved through a wave solder machine 20 so that the longitudinal axis of SMD 16 is substantially aligned with direction 10 (i.e., parallel to the direction of insertion into wave soldering machine 20). Solder wave 24 is perpendicular to the direction printed circuit board 8 passes through the wave. Turbulent action of the solder wave deposits solder on both solder pads. Because leading solder pad 12 is smaller than the SMD body, the molten solder is allowed to wet leading solder pad 12 and still flow around SMD 16 without obstruction. The molten solder then wets the portion of trailing solder pad 14 that is wider than the body of SMD 16. When the molten solder contacts trailing solder pad 14, the entire surface of trailing solder pad 14 becomes wet with molten solder including the portion of the pad behind SMD 16.

The present invention can be used in combination with several SMDs in different orientations to efficiently use the board space while ensuring that all solder connections are properly made.

What is claimed is:

1. A printed circuit board assembly comprising:
   a printed circuit board;
   a surface mount device having a first end and second end wave soldered to said printed circuit board;
   a first solder pad deposited on said printed circuit board having a width not greater than the width of said first end; and
   a second solder pad deposited on said printed circuit board having a width greater than the width of said second end;
   said first pad and said second pad oriented so that said first end is wave soldered to said first pad before said second end is wave soldered to said second pad.

2. The printed circuit board assembly as in claim 1 wherein said first and second solder pads are rectangular.

3. The printed circuit board assembly as in claim 1 wherein said second solder pad has rounded corners.

* * * * *